(12) United States Patent
Sakuyama

(10) Patent No.: US 7,189,927 B2
(45) Date of Patent: Mar. 13, 2007

(54) ELECTRONIC COMPONENT WITH BUMP ELECTRODES, AND MANUFACTURING METHOD THEREOF

(75) Inventor: Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 10/434,151

(22) Filed: May 9, 2003

(65) Prior Publication Data

US 2003/0214795 A1 Nov. 20, 2003

(30) Foreign Application Priority Data

May 17, 2002 (JP) ............................. 2002-143773

(51) Int. Cl.
*H05K 1/11* (2006.01)
*H05K 3/00* (2006.01)
*H01R 12/04* (2006.01)
*H01R 9/00* (2006.01)

(52) U.S. Cl. ........................ 174/261; 29/842; 29/843

(58) Field of Classification Search ................ 174/260, 174/261; 257/737, 738; 29/842, 843
See application file for complete search history.

(56) References Cited

U.S. PATENT DOCUMENTS

| | | | | |
|---|---|---|---|---|
| 4,970,571 | A * | 11/1990 | Yamakawa et al. | 257/737 |
| 5,060,844 | A * | 10/1991 | Behun et al. | 228/180.21 |
| 5,479,703 | A * | 1/1996 | Desai et al. | 29/852 |
| 6,028,011 | A | 2/2000 | Takase et al. | |
| 6,291,897 | B1 * | 9/2001 | Wark et al. | 257/786 |
| 6,348,730 | B1 * | 2/2002 | Yi et al. | 257/737 |
| 6,426,556 | B1 * | 7/2002 | Lin | 257/738 |
| 6,504,105 | B1 * | 1/2003 | Acocella et al. | 174/255 |
| 6,798,050 | B1 * | 9/2004 | Homma et al. | 257/678 |
| 2001/0056174 | A1 * | 12/2001 | Okada et al. | 528/310 |
| 2002/0121709 | A1 * | 9/2002 | Matsuki et al. | 257/786 |

FOREIGN PATENT DOCUMENTS

| | | |
|---|---|---|
| JP | 4-112537 | 4/1992 |
| JP | 11-340270 | 12/1999 |

* cited by examiner

*Primary Examiner*—Dean Reichard
*Assistant Examiner*—Jeremy C. Norris
(74) *Attorney, Agent, or Firm*—Stass & Halsey LLP

(57) ABSTRACT

An electronic component with bump electrodes includes a surface-protecting insulating film of adequate thickness and bump elements of adequate height, and allows the occurrence of open defects in the manufacturing process to be appropriately reduced. An electronic component with bump electrodes (X1) includes a substrate (11), electrode pads (12) provided on the substrate (11), an insulating film (13) that has openings (13a) in correspondence with the electrode pads (12) and is laminated and formed on the substrate (11), electroconductive connecting elements (14) provided on the electrode pads (12) in the openings (13a), and bump elements (15) that are in direct contact with the electroconductive connecting elements (14) and project from the openings (13a).

17 Claims, 14 Drawing Sheets

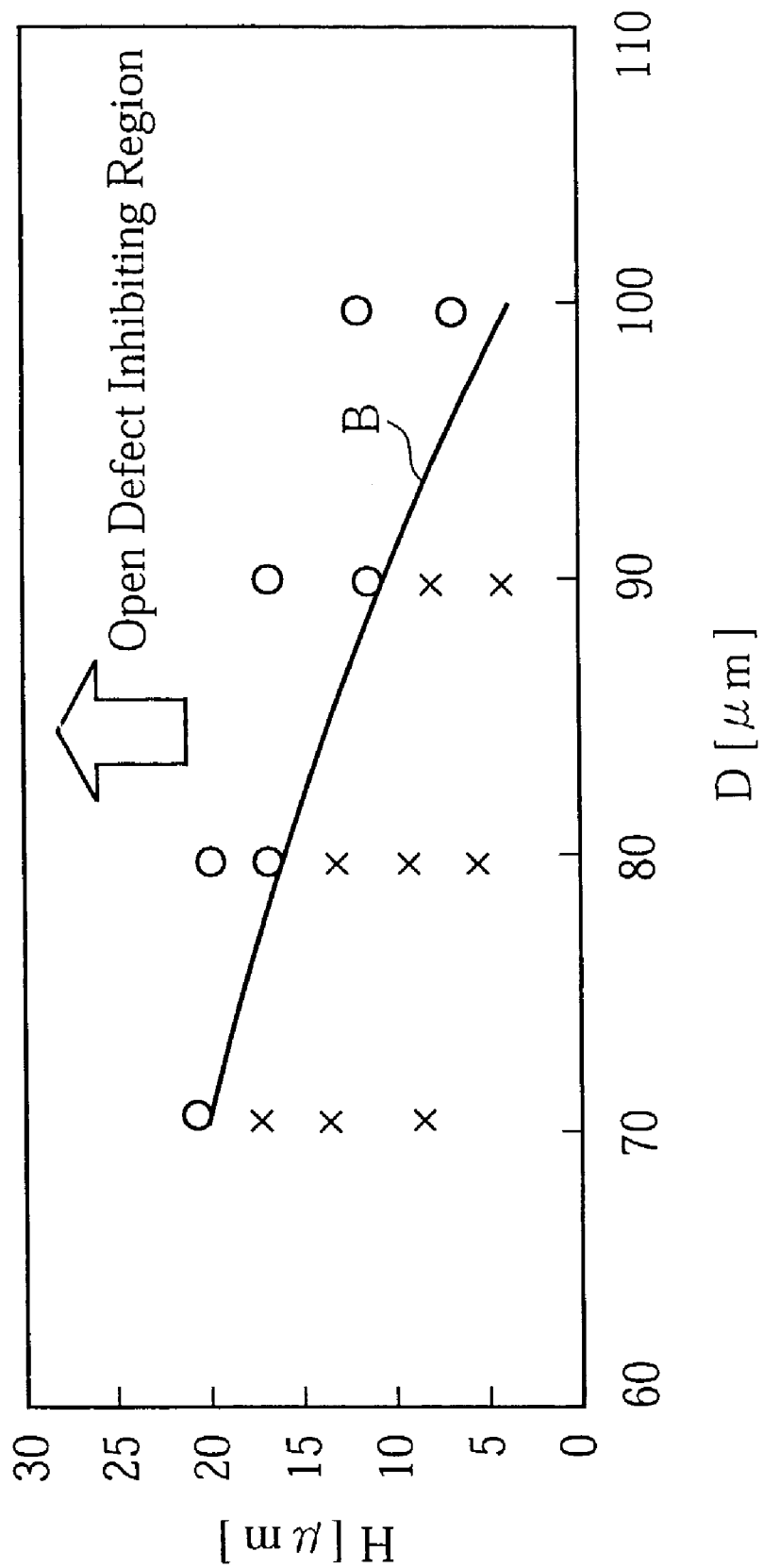

ELECTRONIC COMPONENT WITH BUMP ELECTRODES, AND MANUFACTURING METHOD THEREOF

BACKGROUND OF THE INVENTION

1. Field of the Invention

The present invention relates to an electronic component with bump electrodes, and to a manufacturing method thereof. More particularly, the present invention relates to a semiconductor chip, printed wiring board, or other electronic component with bump electrodes such as a ball grid array (BGA), and to a manufacturing method thereof.

2. Description of the Related Art

The need for higher density in the packaging of electronic components on printed wiring boards, ceramic boards, and the like has increased in recent years, and bare chip packaging has attracted attention as a technology that satisfies this need. In bare chip packaging, the trend is in the direction of adopting face-down mounting or flip-chip bonding, which is accomplished by interposing bumps between a semiconductor chip and the electrode pads of a wiring board, instead of using the conventional face-up mounting, which is accomplished by wire bonding of electrical connections between the semiconductor chip and the board wiring. In face-down mounting, bump electrodes are formed in advance on the mounting surface of an unpackaged semiconductor chip or wiring board to allow bumps to be interposed between the semiconductor chip and the electrode pads of the wiring board.

FIGS. 12a–12e depict an example of a conventional method for manufacturing a semiconductor chip with bump electrodes. In this conventional method, a specific metal mask 44 is prepared for the semiconductor chip 40, as shown in FIG. 12a. A wiring pattern that contains electrode pads 42 (only the electrode pads 42 are shown) is formed on the surface of the substrate 41 in the semiconductor chip 40. An insulating film 43 for protecting the wiring pattern is further laminated and formed over the wiring pattern on the substrate 41. The insulating film 43 has openings 43a at positions that correspond to each of the electrode pads 42. The metal mask 44 has openings 44a formed in advance at positions that correspond to the electrode pads 42 and openings 43a.

The openings 44a and electrode pads 42 are then aligned, and the metal mask 44 is placed on the semiconductor chip 40, as shown in FIG. 12b. Solder paste 45 containing a specific solder powder is subsequently fed by printing to the openings 44a in the metal mask 44 and the openings 43a in the insulating film 43, as shown in FIG. 12c. The metal mask 44 is then removed from the semiconductor chip 40, with the solder paste 45 left behind, as shown in FIG. 12d. A heating treatment is subsequently conducted in order to temporarily melt the solder powder in the solder paste 45, and bump elements 46 are formed on the electrode pads 42, as shown in FIG. 12e.

The semiconductor chip 40 provided with bump electrodes in this manner is flip-chip bonded to a wiring board 50, as shown in FIG. 13a. Specifically, the electrode pads 42 of the semiconductor chip 40 and the electrode pads 52 of the wiring board 50 are electrically and mechanically connected via the bump elements 46. With such flip-chip bonding, an adhesive or an underfiller 60 is commonly packed between the semiconductor chip 40 and wiring board 50, as shown in FIG. 13b. The underfiller 60 protects the bump elements 46 for connecting the electrode pads, and also protects the mounting surfaces of the semiconductor chip 40 and wiring board 50. With such an underfiller 60, connection reliability can be maintained for a long time in this type of flip-chip bonding.

However, so-called open (non-contact) defects often occur in the bump electrode structure of the conventional method for manufacturing an electronic component with bump electrodes described above with reference to FIGS. 12a–12e. An open defect is a defect in which the bump-forming material primarily balls up on the insulating film 43 during the heating treatment described above with reference to FIG. 12e, and gaps are formed between the electrode pads 42 and bump elements 46, as shown, for example, in FIGS. 14a and 14b. An electrical connection between the electrode pads 42 and bump elements 46 cannot be adequately formed if an open defect occurs. The open defect shown in FIG. 14a assumes a condition in which the entire bump-forming material is balled up on the insulating film 43, and is apt to occur when solder paste is used as the bump-forming material in the above-described manner. The open defect shown in FIG. 14b assumes a condition in which some of the bump-forming material remains on the electrode pads 42 and the rest of the material is balled up on the insulating film 43, and is apt to occur when molten solder or solder plating is used as the bump-forming material.

The electrode pads 42 formed on the substrate 41 of the semiconductor chip 40 serve as part of the wiring formed in a pattern on the surface of the substrate 41, and have the same specific thickness as the other wiring locations. The insulating film 43 for covering and protecting this wiring is required to have a minimum given thickness in accordance with the thickness of the wiring. The greater the thickness of the insulating film 43 is made in order to make wiring protection more secure, the deeper the electrode pads 42 are located in the openings 43a of the insulating film 43. The deeper the electrode pads 42 are located in the openings 43a, the more likely it is that open defects such as those shown in FIG. 14 will occur. By contrast, the thinner the insulating film 43 is made in order to suppress such open defects, the more likely it is that insulation defects will be caused by the formation of pinholes in the insulating film 43. Specifically, the ability of the insulating film 43 to cover the wiring will be adversely affected. In addition, sometimes it becomes impossible to handle a fine pitch if the diameter of the openings 43a in the insulating film 43 is increased.

Meanwhile, it is desirable that the bump elements 46 be made higher within the constraints of the electrode pitch. This is because the gap between the semiconductor chip 40 and the wiring board 50 must be widened in order to allow this gap to be more adequately filled with the underfiller 60 for maintaining the reliability of connections, as shown in FIG. 13b. The surface curvature of higher bump elements 46, that is, larger-volume bump elements 46, tends to be lower, so the degree to which such higher bump elements 46 can penetrate into the openings 43a tends to decrease as well. The less the degree is to which the bump elements 46 can penetrate into the openings 43a, the more likely it is that open defects such as those shown in FIGS. 14a and 14b will occur.

It is thus necessary to increase the thickness of the insulating film beyond a certain value and to increase the height of the bump elements beyond a certain value at a certain electrode pitch of an electronic component with such bump electrodes. This is why open defects such as those shown in FIGS. 14a and 14b often occur in the currently employed electronic components designed as conventional bump electrode structures with progressively narrower electrode pitches.

SUMMARY OF THE INVENTION

An object of the present invention, which was devised in view of this situation, is to provide an electronic component with bump electrodes that comprises a surface-protecting insulating film of adequate thickness and bump elements of adequate height, and allows the occurrence of open defects in the manufacturing process to be appropriately reduced; and to provide a manufacturing method thereof.

According to a first aspect of the present invention, an electronic component with bump electrodes is provided. This electronic component comprises a substrate, electrode pads provided on the substrate, an insulating film that has openings in correspondence with the electrode pads and is laminated and formed on the substrate, electroconductive connecting elements provided on the electrode pads in the openings, and bump elements that are in direct contact with the electroconductive connecting elements and extend from the openings.

The electronic component with bump electrodes thus configured comprises a surface-protecting insulating film of adequate thickness and bump elements of adequate height, and allows the occurrence of open defects in the manufacturing process to be appropriately reduced. In the electronic component according to the first aspect, the electroconductive connecting elements are interposed between the electrode pads and bump elements. These electroconductive connecting elements are provided on the electrode pads and are in direct contact with the bump elements in the openings of the insulating film. By providing electroconductive connecting elements that have an appropriate thickness or height, it is possible to form an insulating film that has sufficient thickness for protecting the wiring pattern on the substrate surface in the electronic component while suppressing the occurrence of open defects between the electrode pads and bump elements, and to form bump elements of adequate height without any dependence on the depth at the electrode pad positions of the openings.

Japanese Patent Application Laid-open No. 4-112537 discloses a technique aimed at reducing the number of open defects, with this technique based on the adoption of electroplating during the formation of bump elements. For this reason, current-carrying layers for performing electroplating must be formed, removed by etching, or the like on the surface-protecting insulating film in accordance with this technique, making it difficult to manufacture electronic components with bump electrodes at an adequate yield. By contrast, the bump elements in the present invention are formed while in direct contact with the electroconductive connecting elements. Specifically, the bump elements need not be formed by electroplating. In addition, the bump elements and electrode pads on the substrate surface are electrically connected by an electroless plating layer in the technique disclosed in Japanese Patent Application Laid-open No. H4-112537. The electroless plating layer must be formed until it becomes level with the surface of the insulating film in order to form adequate electroplated bump elements, and considerable time is required to form such an electroless plating layer. It is therefore difficult to manufacture electronic components with bump electrodes at a high yield by means of the technology disclosed in the above application.

According to a preferred embodiment, the electroconductive connecting elements have lead-in projections in contact with the bump elements. The above-described effects of the electroconductive connecting elements can be attained by ensuring that only part of the uppermost surface in the electroconductive connecting elements is kept at an adequate height, without the need to make the height of the uppermost surface uniform.

The height H of the electroconductive connecting elements from the substrate, the theoretical penetration depth h into perfectly spherical openings that have the same volume as the bump elements, and the thickness L of the insulating film are preferably related as $H+h>L$. The number of open defects can be adequately reduced based on such an arrangement.

The electroconductive connecting elements preferably have a laminated structure that comprises a plurality of layers. The layer in contact with the electroconductive connecting elements or with the bump elements in the electroconductive connecting elements is preferably composed of Au or Sn. The layer in contact with the electroconductive connecting elements or with the bump elements in the electroconductive connecting elements is preferably composed of a material capable of melting at or below the melting temperature of the bump elements. With these arrangements, the electroconductive connecting elements can have a large number of aspects, and a preferred arrangement can be provided once an adequate electrical connection has been established for the electroconductive connecting elements.

The bump elements are preferably composed of a metal material selected from the group comprising tin, indium, lead, bismuth, silver, copper, zinc, and antimony. It is preferable to form bumps with the desirable composition from such metal materials.

According to a second aspect of the present invention, a method for manufacturing an electronic component with bump electrodes is provided. This manufacturing method comprises a step for forming electroconductive connecting elements in the openings on electrode pads in a substrate that comprises the electrode pads and an insulating film having openings in correspondence with the electrode pads, and a step for forming bump elements on the electroconductive connecting elements so as to project from the openings while in direct contact with the electroconductive connecting elements.

According to the second aspect of the present invention, it is possible to manufacture the electronic component relating to the first aspect. According to the method relating to the second aspect, it is possible to manufacture an electronic component with bump electrodes that comprises a surface-protecting insulating film of adequate thickness and bump elements of adequate height while allowing the occurrence of open defects in the manufacturing process to be appropriately reduced.

The step for forming the electroconductive connecting elements is preferably conducted by electroless plating and/or electroplating. A plurality of plating materials is preferably deposited in a sequential manner in the step for forming the electroconductive connecting elements. The step for forming the electroconductive connecting elements preferably comprises a step for forming lead-in projections that extend in the direction of the positions in which the bump elements are formed. Adequate electroconductive connecting elements can be formed by adopting such arrangements.

In a preferred embodiment, the step for forming the bump elements comprises a step for laminating and forming a resin film on the insulating film, a step for forming openings in the resin film so that the electroconductive connecting elements are exposed, a step for feeding solder paste to the openings of the resin film, a step for forming bump elements from the solder paste through a heating treatment, and a step for stripping the resin film from the insulating film. Alternatively, the step for forming bump elements may comprise a step for laminating and forming a resin film on the insulating film, a step for forming openings in the resin film so as to expose the electroconductive connecting elements, a step for feeding molten solder to the openings of the resin film, a step for cooling the molten solder and forming bump elements, and a step for stripping the resin film from the insulating film. Alternatively, the step for forming bump elements may also comprise a step for laminating and forming a resin film on the insulating film, a step for forming openings in the resin film so as to expose the electroconductive connecting elements, a step for depositing solder material in the opening of the resin film by plating, a step for forming bump elements from the solder material through a heating treatment, and a step for stripping the resin film from the insulating film. Alternatively, the step for forming bump elements may further comprise a step for placing a solder ball in each of the openings in the insulating film, and a step for forming bump elements from the solder balls through a heating treatment. The resin film is preferably a photosensitive resin film when the resin film is used in the formation of bump elements.

In the second aspect of the present invention, the electroconductive connecting elements and bump elements are formed such that the height H of the electroconductive connecting elements from the substrate, the theoretical penetration depth h into perfectly spherical openings that have the same volume as the bump elements, and the thickness L of the insulating film satisfy the relation $H+h \geq L$.

BRIEF DESCRIPTION OF THE DRAWINGS

FIG. 2 is a relationship diagram of the conditions relating to the electronic component shown in FIG. 1;

DESCRIPTION OF THE PREFERRED EMBODIMENTS

Figure 1:
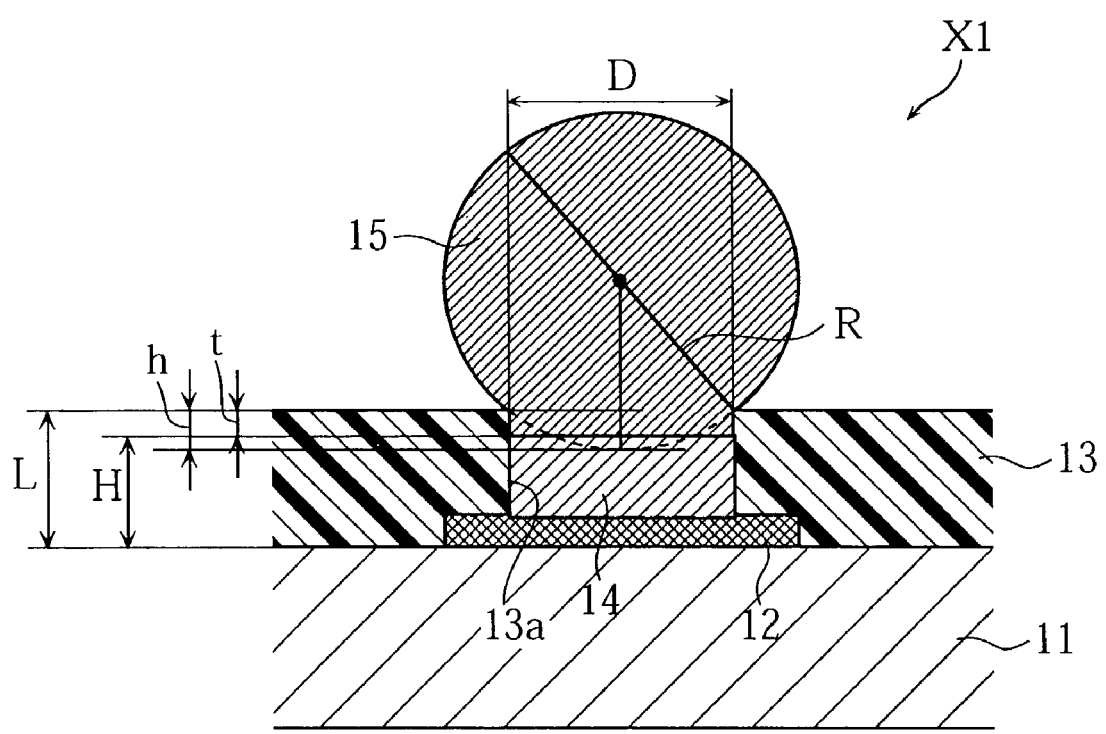
FIG. 1 is a fragmentary cross-sectional view of an electronic component with bump electrodes according to a first embodiment of the present invention.

FIG. 1 is a fragmentary cross-sectional view of an electronic component X1 with bump electrodes relating to a first embodiment of the present invention. The electronic component X1 corresponds to a semiconductor chip, printed wiring board, or the like, and comprises a substrate 11, an electrode pad 12, an insulating film 13, an electroconductive connecting element 14, and a bump element 15. A wiring containing the electrode pad 12 is formed in a pattern on the surface of the substrate 11. The insulating film 13 is provided on the substrate 11 in order to cover and protect the wiring, and has an opening 13a at a location that corresponds to the electrode pad 12. The electroconductive connecting element 14 is provided on the electrode pad 12 in the opening 13a. The bump element 15 is provided in direct contact with the top surface of the electroconductive connecting element 14 and extends outside from the opening 13a.

In the present embodiment, the height H, theoretical penetration depth h, and thickness L satisfy the relation of Eq. (1) below, where H [μm] is the height of the electroconductive connecting element 14 from the substrate 11, h [μm] is the theoretical penetration depth of the bump element 15, and L [μm] is the thickness of the insulating film 13. As used herein, the theoretical penetration depth h of the bump element 15 refers to the maximum length to which a perfect sphere, assuming that this perfect sphere has the same volume as the bump element 15, can theoretically penetrate into the opening 13a when this sphere is placed such that the opening 13a, which is presumed to constitute a cavity, is blocked.

$$H+h \geq L \quad (1)$$

The theoretical penetration depth h [μm] is expressed by Eq. (2) below, wherein D [μm] is the diameter of the opening 13a in the insulating film 13, and R [μm] is the diameter of a perfect sphere, assuming that this sphere has the same volume as the bump element 15 balled up so as to block the opening 13a. In Eq. (2), the first term on the right-hand side is the radius of the perfectly spherical bump element, and the second term on the right-hand side, which is derived based on the Pythagorean theorem, is the distance from the center of the perfectly spherical bump element to the opening 13a.

$$h = \frac{R}{2} - \sqrt{\left(\frac{R}{2}\right)^2 - \left(\frac{D}{2}\right)^2} \quad (2)$$

In addition, t can be represented by Eq. (3) below $$t = L - H \quad (3),$$

where t [μm] is the depth of the top surface of the insulating film 13 in relation to the topmost surface of the electroconductive connecting element 14.

The bump element 15 and the electroconductive connecting element 14 connected to the electrode pad 12 must be physically connected in order to prevent electric open defects from occurring between the electrode pad 12 and bump element 15. The electroconductive connecting element 14 and the bump element 15 tend to maintain secure contact when h and t satisfy Eq. (4) below.

$$h \geq t \quad (4)$$

Consequently, by substituting Eqs. (2) and (3) into Eq. (4), it is possible to derive Eq. (5) for a condition in which open defects are adequately inhibited.

$$\frac{R}{2} - \sqrt{\left(\frac{R}{2}\right)^2 - \left(\frac{D}{2}\right)^2} \geq L - H \quad (5)$$

-continued $$\therefore H \geq L - \left\{ \frac{R}{2} - \sqrt{\left(\frac{R}{2}\right)^2 - \left(\frac{D}{2}\right)^2} \right\}$$

The relationship diagram shown in FIG. 2 is obtained when the height H of the electroconductive connecting element 14 is plotted on the horizontal axis, and the diameter D of the opening 13a is plotted on the vertical axis in a case in which the length L of the insulating film 13 is 30 [μm] and the diameter R of the ideally spherical bump element is 120 [μm]. In FIG. 2, the circle plots indicate that Eq. (5) is satisfied, and the cross-out plots that Eq. (5) is not satisfied. Based on these plots, it is possible to obtain a borderline graph B for distinguishing between a conditional area in which open defects can be significantly inhibited, and a conditional area in which such inhibition is impossible.

In a conventional bump electrode structure of a semiconductor chip having a BGA or the like, H=0 because of the absence of electroconductive connecting elements. Eq. (6) is obtained if it is assumed that the height of the electrode pad from the substrate is 0, Eq. (5) is transformed by substitution of H=0, and the two sides are connected by the equal sign alone. In addition, Eq. (7) can be obtained by transforming Eq. (6).

$$L = \left\{ \frac{R}{2} - \sqrt{\left(\frac{R}{2}\right)^2 - \left(\frac{D}{2}\right)^2} \right\} \quad (6)$$

$$R = \frac{\left(\frac{D}{2}\right)^2 + L^2}{L} \quad (7)$$

In Eq. (6), which describes the bump electrode structure provided to a conventional semiconductor chip or the like, the value of the right-hand side decreases and the value of thickness L converges to 0 as the opening diameter D decreases with the narrowing of the electrode pitch at a constant R, that is, bump element size, on the right-hand side. This means that a conventional bump electrode structure tends to be affected in a straightforward manner by a problem whereby the ability of the insulating film to cover the wiring on the substrate surface decreases with a reduction in the opening diameter D.

In Eq. (7), which describes the bump electrode structure provided to a conventional semiconductor chip or the like, the value of the right-hand side decreases and the value of the bump element diameter R converges to the value of thickness L as the opening diameter D decreases with the narrowing of the electrode pitch at a constant L, that is, insulating film thickness, on the right-hand side. The convergence of the value of bump element diameter R to the value of thickness L corresponds to the fact that the height of the bump lead-in from the surface of the insulating film converges to 0. This means that a conventional bump electrode structure tends to be affected in a straightforward manner by a problem whereby the height of the bump element decreases and filling with the underfiller becomes more difficult to accomplish as the opening diameter D becomes smaller.

By contrast, the height H of the electroconductive connecting element 14 from the substrate 11 in the present invention has the action of moderating the trends of the prior art described above with reference to Eqs. (6) and (7). Considering the height of electrode pads produces the same results with respect to such benefits of the present invention.

Figure 3A:
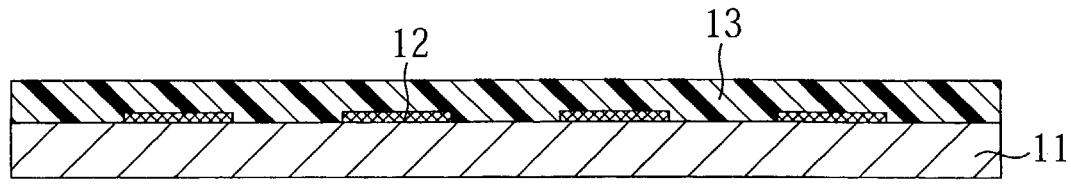
FIGS. 3a–3e depict some of the steps involved in the method for manufacturing the electronic component shown in FIG. 1.
Figure 3B:
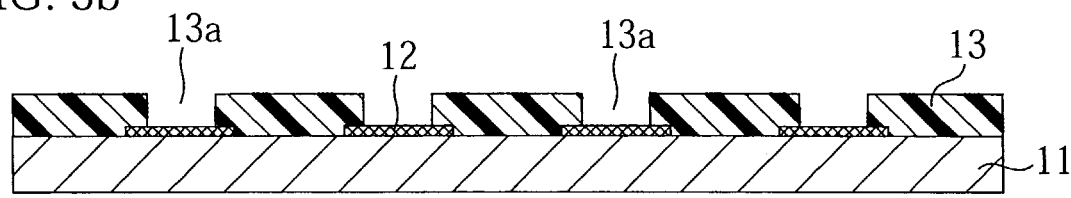
Figure 3C:
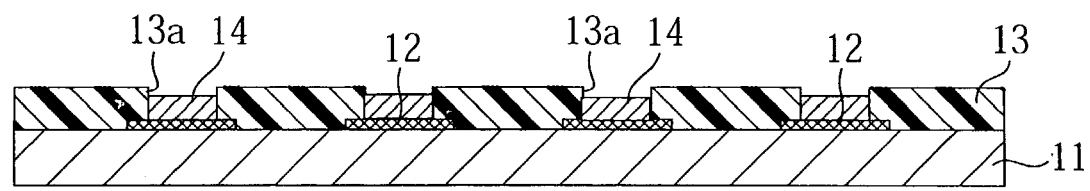
Figure 3D:
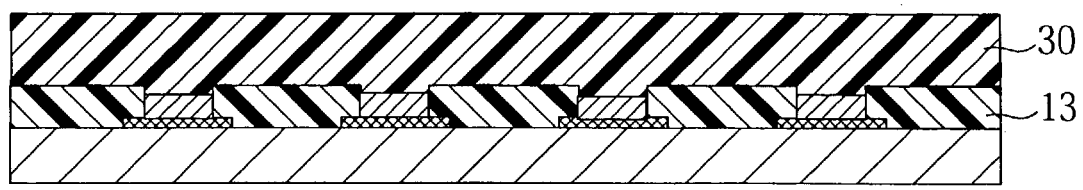
Figure 3E:
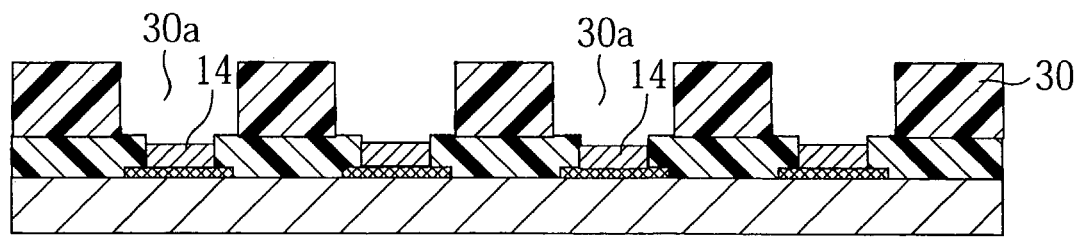
Figure 4:
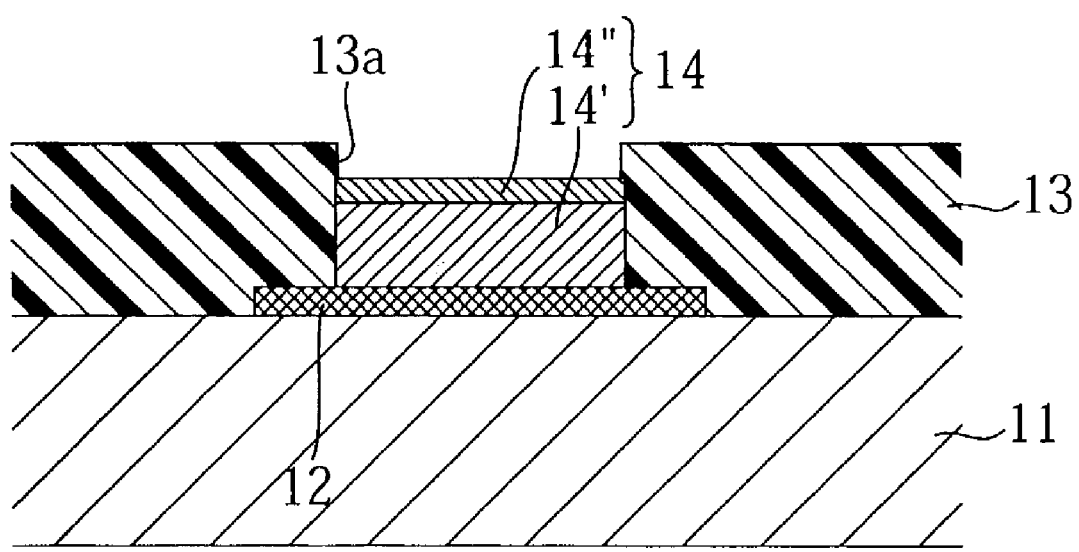
FIG. 4 depicts an electroconductive connecting element having a laminated structure.

FIGS. 3 to 5 depict the method for manufacturing an electronic component X1. To manufacture the electronic component X1, an insulating film 13 is first laminated and formed on a substrate 11 whose surface is provided with electrode pads 12 so as to cover the electrode pads 12, as shown in FIG. 3a. At this time, the insulating film 13 is formed such that the aforementioned Eq. (1) is satisfied for the ultimately obtained electronic component X1 in terms of the thickness L shown in FIG. 1. To form the insulating film 13, a liquid resin composition for forming the insulating film is applied to the substrate 11 by spin coating or by a printing technique that uses a screen mask, and the product is dried. Alternatively, it is also possible to place a resin composition in the form of a film on the substrate 11 and to then bond the elements under heat and pressure at 50 to 140° C. using a laminator or the like to form the insulating film 13. A resin material comprising epoxy acrylate, polyimide, or the like may be used as the resin composition for forming the insulating film.

Openings 13a are subsequently formed in the insulating film 13 at locations that correspond to the individual electrode pads 12, as shown in FIG. 3b. A UV-YAG laser, carbon dioxide laser, excimer laser, or the like may be used to form the openings 13a. Photolithography may be adopted for forming the openings 13a when an insulating film 13 having photosensitivity has been formed.

Electroconductive connecting elements 14 are subsequently formed on the electrode pads 12 in the openings 13a, as shown in FIG. 3c. At this time, the electroconductive connecting elements 14 are formed such that the aforementioned Eq. (1) is satisfied for the ultimately obtained electronic component X1 in terms of the height H shown in FIG. 1.

The electroconductive connecting elements 14 can be formed by electroplating or electroless plating. If electroless plating is adopted in the formation of the electroconductive connecting elements 14, a specific catalyst is first made to adhere to the surface of at least the electrode pads 12 in the openings 13a, as shown in FIG. 3b. The electroconductive connecting elements 14 are subsequently deposited and grown on the electrode pads 12 by electroless plating, using the catalyst as a nucleus. If electroplating is adopted in the formation of the electroconductive connecting elements 14, a current-carrying layer may first be formed by sputtering or the like of Ti, Ni, or the like so as to cover the insulating film 13 and the electrode pads 12 in the condition shown in FIG. 3b, for example. A technique in which full electroless plating is performed such that the insulating film 13 and the electrode pads 12 are covered may be adopted instead of sputtering in the formation of the current-carrying layer. A plating resist is then formed in a pattern on the current-carrying layer. The plated resist pattern is perforated in accordance with the openings 13a. The electroconductive connecting elements 14 are then deposited and grown by electroplating in the openings 13a. The plated resist pattern is subsequently etched away, and the current-carrying layer on the insulating film 13 is also etched away.

Al, Au, In, Sn, Cu, Ag, Pd, or another elemental metal, or an alloy comprising a plurality of elemental metals selected from among Sn, Pb, Ag, Cu, In, Bi, Zn, Sb, Al, Au, and the like may be used as the material for forming the electroconductive connecting elements 14. For example, the electroconductive connecting elements 14 can be formed from In, an Sn—Bi alloy, or other low-melting metal. When the electroconductive connecting elements 14 are formed from a low-melting metal, it is sometimes possible to design electrical connections with bump elements 15 at a comparatively low temperature in the subsequent steps. It is possible in this case to inhibit heating-induced defects; for example, warping of the substrate 11 or the like, in the ultimately obtained electronic component X1.

Electroconductive connecting elements 14 with a multilayer structure such as the one shown in FIG. 4 may also be formed by the sequential lamination of metals with different compositions. For example, low-resistance Cu may be thickly deposited on the electrode pads 12 to form an underlayer 14', and Sn, which has low hardness and possesses a lower melting point than does Cu, may then be thinly deposited on the surface of the underlayer 14' to form a top layer 14" in the step shown in FIG. 3c. In an electroconductive connecting element 14 having such a laminated structure, it is the Sn plating, which is the top layer 14", that is brought into direct contact with the bump elements 15 in the subsequent steps. When a comparatively low-melting or low-hardness metal material is used at locations that are in contact with the bump elements 15 while a metal material with a low electric resistance is used as the principal component, it is possible to form a low-resistance electric contact in an appropriate manner when connecting the electroconductive connecting elements 14 and the bump elements 15.

A resin film 30 is laminated and formed after the electroconductive connecting elements 14 have been formed, as shown in FIG. 3d. To form the resin film 30, a resin composition in the form of a film is placed on the side of the lamination surface and compression bonded while heated to 50 to 140° C. Alternatively, it is possible to apply a liquid resin composition to the lamination surface by spin coating or by a printing technique that uses a screen mask, and to dry the product.

An acrylate resin having photosensitivity or a non-photosensitive resin may be used as the resin composition for forming the resin film 30. When a photosensitive acrylate resin is used, photolithography can be adopted during the formation of openings 30a described below. The resin composition for forming the resin film 30 may be in the form of a liquid or film. The resin composition for forming the resin film 30 is preferably a dry film having photosensitivity. Formation of the resin film 30 can be simplified by the use of a photosensitive dry film. The resin film 30 is formed from a resin composition whose basic composition is different from that of the insulating film 13. This condition serves to reduce damage to the insulating film 13 during the below-described step of stripping the resin film 30 with the aid of an alkali stripping solution. In addition, the thickness of the resin film 30 is preferably set to 30 to 150 μm because of considerations related to the fact that bumps are formed on electrode pads 12 disposed at a fine pitch.

Following the formation of the resin film 30, openings 30a are formed in the resin film 30 at locations that correspond to each of the electroconductive connecting elements 14, as shown in FIG. 3e. A UV-YAG laser, carbon dioxide laser, excimer laser, or the like may be used to form the openings 30a. Photolithography may be adopted for forming the openings 30a when the resin film 30 having photosensitive has been formed. Photolithography is preferably adopted because of considerations related to reducing damage to the electroconductive connecting elements 14. When photolithography is adopted, the openings 30a are formed to expose the electroconductive connecting elements 14 by subjecting the resin film 30 to an exposure treatment through a specific photomask (not shown) and to a subsequent developing treatment.

Figure 5A:
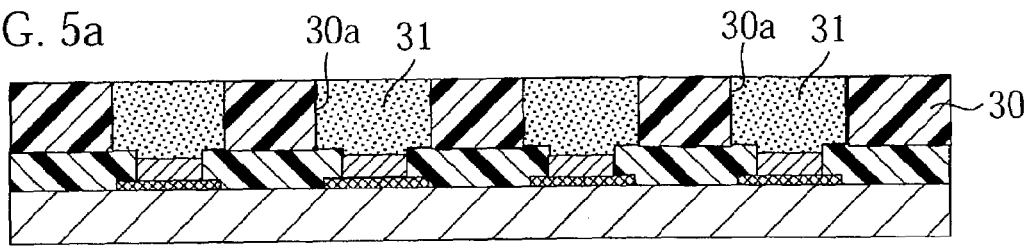
FIGS. 5a–5e depict steps that follow FIG. 3e.

The openings 30a are subsequently filled with solder paste 31, as shown in FIG. 5a. Such filling with the solder paste 31 is performed by a printing technique that uses a squeegee (not shown). A urethane foam squeegee is used as such a squeegee in order to prevent or reduce damage to the resin film 30. Two or more squeegeeing cycles are performed with the squeegee in order to securely fill the openings 30a with a specific amount of solder paste 31.

The solder paste 31 comprises a solder power and a flux vehicle. The solder powder is obtained by pulverizing an elemental metal selected from among Sn, Pb, Ag, Cu, In, Bi, Zn, Sb, or the like, or an alloy comprising a plurality of elemental metals selected therefrom. An amount that satisfies the above-described Eq. (1) is selected for the content of solder powder in the solder paste 31. Specifically, the content of solder powder in the solder paste 31 is designated such that when it is assumed that perfect spheres can be used for the bump elements, which are believed to be in a transitional molten state during the below-described heating treatment, the theoretical penetration depth h of the perfect spheres in the ultimately obtained electronic component X1 satisfy the above-described Eq. (1).

The flux vehicle comprises rosin, an activator, a thixotropic agent, and a solvent. For example, rosin acid, rosin acid esters, rosin anhydride, fatty acids, abietic acid, pimaric acid, isopimaric acid, neoabietic acid, dihydroabietic acid, dehydroabietic acid, and the like may be used as the rosin. For example, one, two, or more organic acids and/or organic amines selected from among sebacic acid, succinic acid, adipic acid, glutaric acid, triethanolamine, monoethanolamine, tributylamine, ethylenediamine, and the like may be used as the activator. Hardened castor oil, hydroxystearic acid, or the like may be used as the thixotropic agent. 2-Methyl-2,4-pentanediol, diethylene glycol monobutyl ether, or the like may be used as the solvent.

Figure 5B:
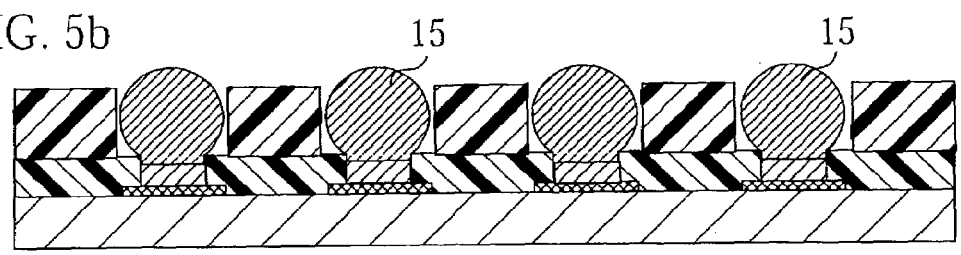

Following the filling of the solder paste 31, bump elements 15 are formed through a heating treatment, as shown in FIG. 5b. Specifically, the solder paste 31 that fills the openings 30a is first melted by heating. The flux vehicle contained in the solder paste 31 is thereby evaporated off, and the solder powder melts and aggregates. The bump elements 15 are formed by the subsequent cooling.

Figure 5C:
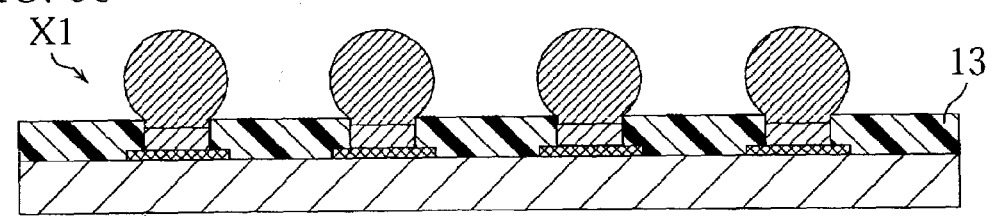

The resin film 30 is subsequently removed by the action of an alkali stripping solution, as shown in FIG. 5c. A strong alkali stripping solution such as an aqueous solution of sodium hydroxide or the like, an organic alkali stripping solution such as an aqueous solution of monoethanolamine, an aqueous solution of tetramethylammonium hydroxide, or the like, or a solution obtained by adding a specific additive thereto may be used as the alkali stripping solution. A compound acting to prevent a stripping residue from being formed by the breakdown of the stripped resin film 30 into small fragments is preferably used as the additive. At this time, an alkali stripping solution with a pH of 11.5 or less should be used in order to minimize damage to the insulating film 13. To perform such alkali removal in an adequate manner, a combination of an insulating film 13 and a resin film 30 that have significant differences in terms of resistance to the alkali stripping solution is adopted in the present embodiment.

The electronic component X1 is manufactured in the above-described series of steps in a manner such that the height H of the electroconductive connecting elements 14 from the substrate 11, the theoretical penetration depth h of the bump elements 15, and the thickness L of the insulating film 13 satisfy the above-described Eq. (1). Consequently, the electronic component X1, while comprising an insulating film 13 of adequate thickness and bump elements 15 of adequate height, does not develop any open defects between the electrode pads 12 and the bump elements 15.

Figure 5D:
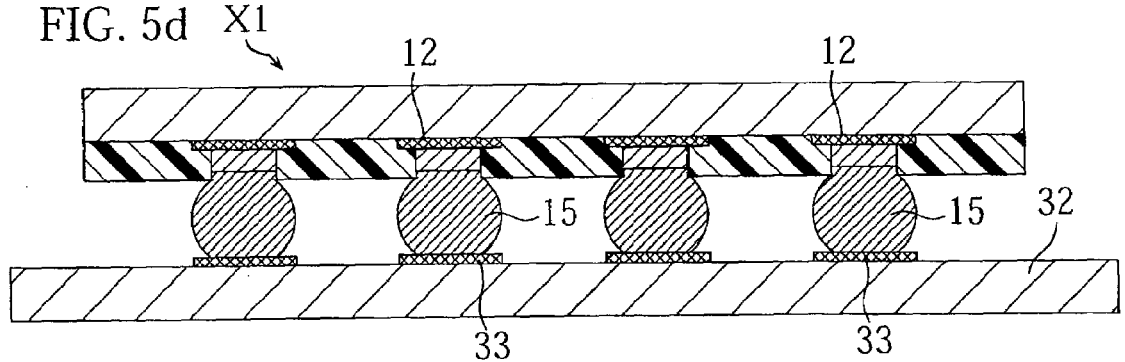
Figure 5E:
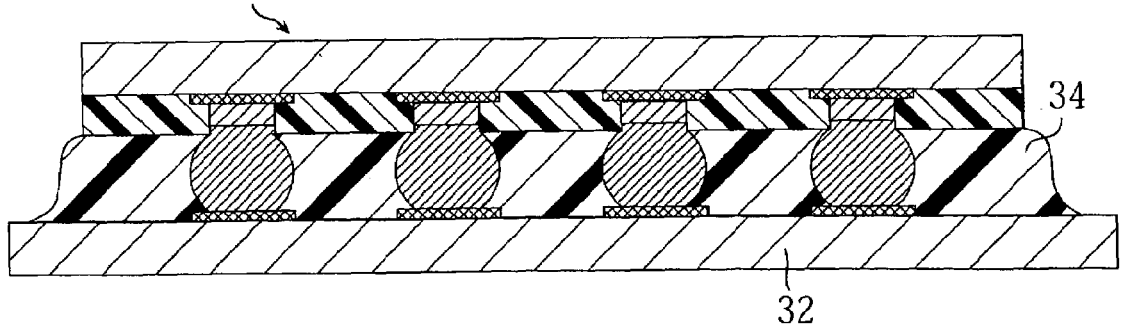

The electronic component X1 with bump electrodes thus manufactured is flip-chip bonded to a wiring board 32 in the manner shown in FIG. 5d when the electronic component X1 is, for example, a semiconductor chip. Specifically, the bump elements 15 and the electrode pads 33 of the wiring board 32 are first aligned opposite each other, and the electronic component X1 is placed on the wiring board 32. The bump elements 15 and electrode pads 33 are then mechanically bonded and electrically connected by reflow heating. The maximum heating temperature of the heating treatment is set, for example, to a level that is 10 to 50° C. above the melting point of the solder. An underfiller 34 is then filled and cured in the space between the electronic component X1 and wiring board 32, as shown in FIG. 5e.

Figure 6A:
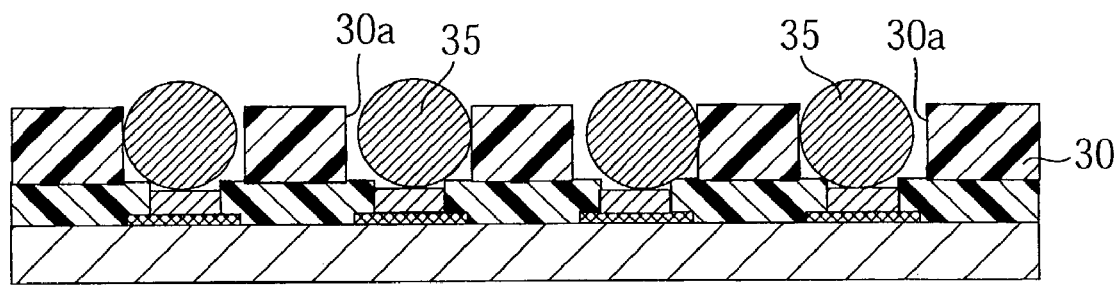
FIGS. 6a–6c depict other steps that follow FIG. 3e.
Figure 6B:
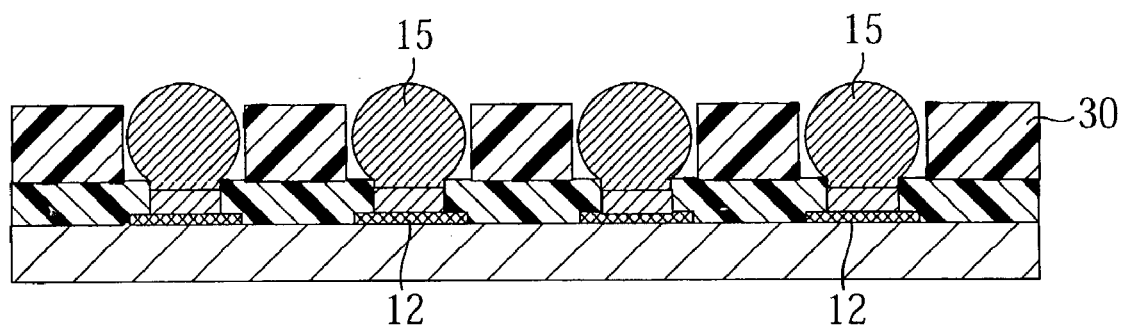
Figure 6C:
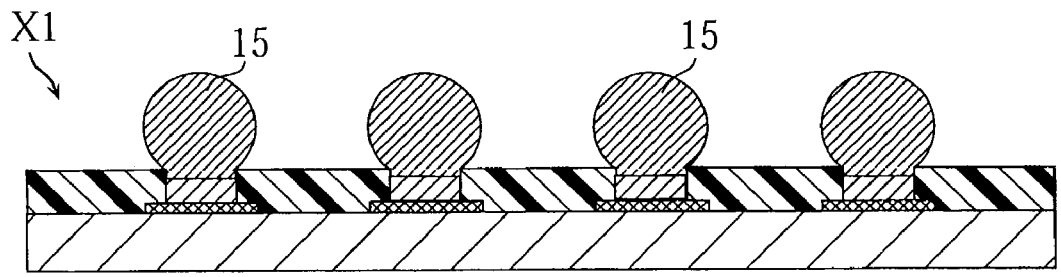

FIGS. 6a–6c depict other steps that follow FIG. 3e in the manufacturing of the electronic component X1. As shown in FIGS. 6a–6c, solder balls 35 can be used instead of the solder paste 31 shown in FIG. 5a as the solder-supplying material for forming the bump elements 15 of the electronic component X1.

Specifically, solder balls 35 are placed in the openings 30a of the resin film 30, as shown in FIG. 6a. The solder balls 35 are obtained by balling up an elemental metal selected from among Sn, Pb, Ag, Cu, In, Bi, Zn, Sb, or the like, or an alloy comprising a plurality of elemental metals selected therefrom. Bump elements 15 are subsequently formed through a heating treatment, as shown in FIG. 6b. Specifically, the solder balls 35 are mechanically and electrically connected to the electrode pads 12 by being temporarily melted by heating. The resin film 30 is subsequently removed by the action of an alkali stripping solution in the same manner as described above with reference to FIG. 5c, as shown in FIG. 6c. The above-described technique also allows bump elements 15 to be formed and an electronic component X1 to be manufactured.

Figure 7A:
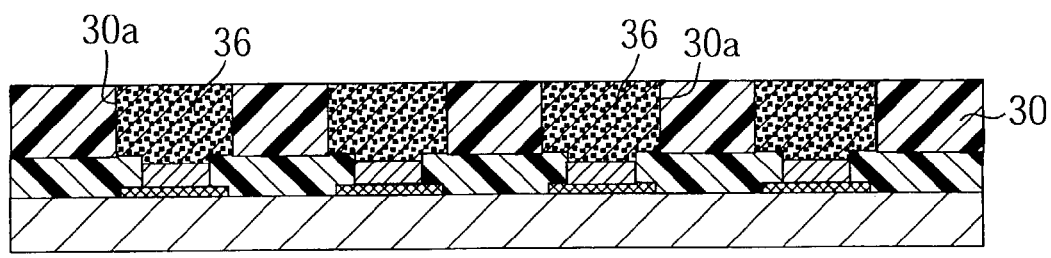
FIGS. 7a–7c depict other steps that follow FIG. 3e.
Figure 7B:
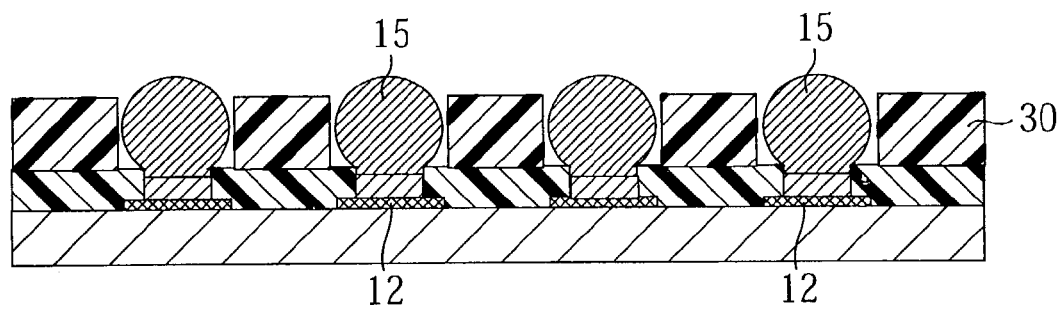
Figure 7C:
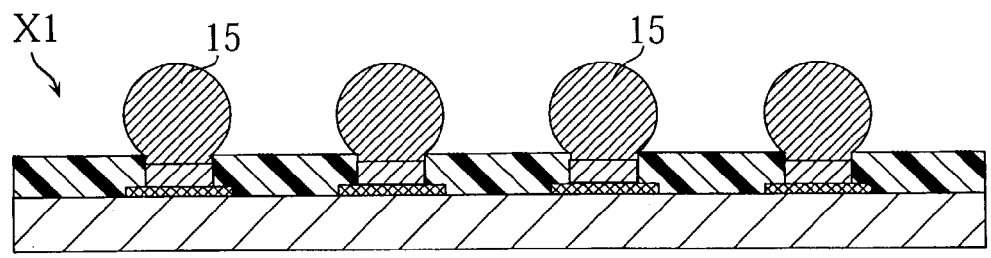

FIGS. 7a–7c depict other steps that follow FIG. 3e in the manufacturing of the electronic component X1. As shown in FIGS. 7a–7c, molten solder 36 can be used instead of the solder paste 31 or solder balls 35 as the solder-supplying material for forming the bump elements 15 of the electronic component X1.

Specifically, the openings 30a of the resin film 30 are first filled with molten solder 36 under heating, as shown in FIG. 7a. The molten solder 36 is obtained by heating and melting an elemental metal selected from among Sn, Pb, Ag, Cu, In, Bi, Zn, Sb, or the like, or an alloy comprising a plurality of elemental metals selected therefrom. The molten solder 36 can be fed by printing or immersing the electronic component in a molten solder bath in the condition shown in FIG. 3e. Bump elements 15 are subsequently formed on the electrode pads 12 by cooling, as shown in FIG. 7b. The resin film 30 is then removed by the action of an alkali stripping solution in the same manner as described above with reference to FIG. 5c, as shown in FIG. 7c. The above-described technique also allows the bump elements 15 of the electronic component X1 to be formed. The bump elements 15 may also be formed by an electroless plating technique that uses the openings 30a of the resin film 30 instead of the above-described technique.

Figure 8:
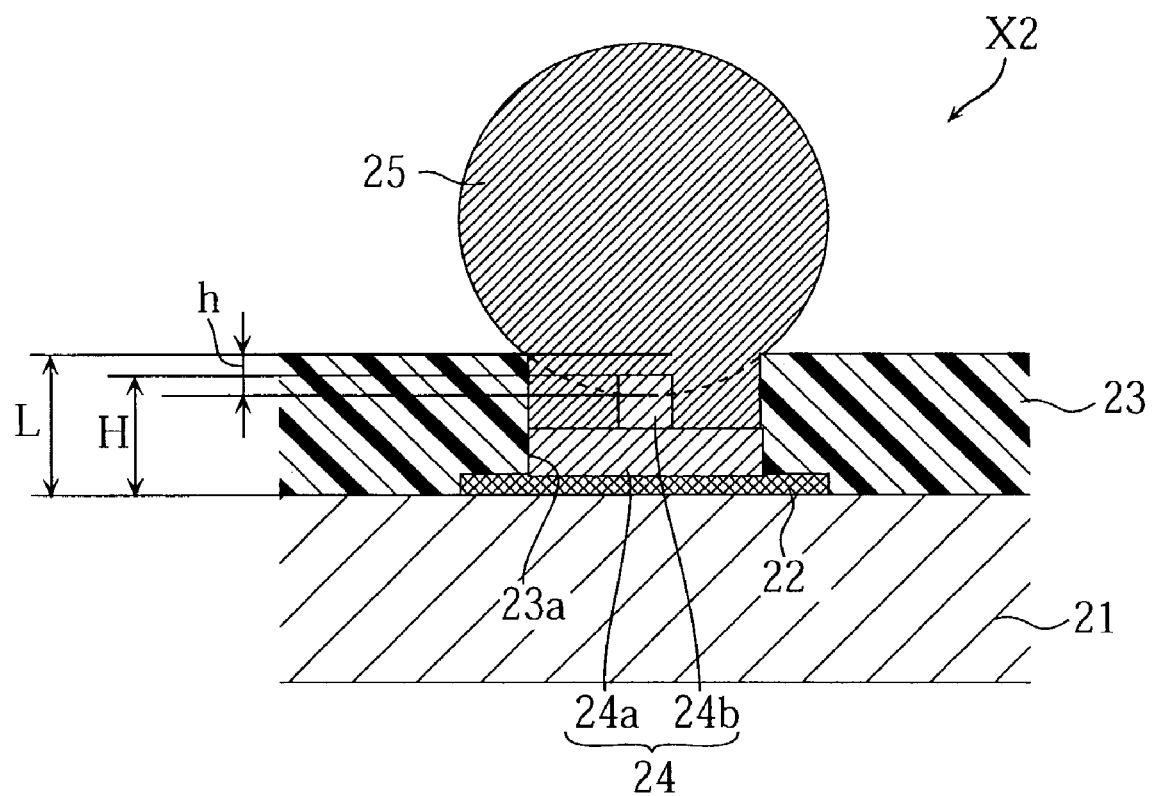
FIG. 8 is a fragmentary cross-sectional view of an electronic component with bump electrodes according to a second embodiment of the present invention.

FIG. 8 is a fragmentary cross-sectional view of an electronic component X2 with bump electrodes according to a second embodiment of the present invention. The electronic component X2 corresponds to a semiconductor chip, printed wiring board, or the like, and comprises a substrate 21, an electrode pad 22, an insulating film 23, an electroconductive connecting element 24, and a bump element 25. A wiring containing the electrode pad 22 is formed in a pattern on the surface of the substrate 21. The insulating film 23 is provided on the substrate 21 in order to cover and protect the wiring, and has an opening 23a at a location that corresponds to the electrode pad 22. The electroconductive connecting element 24 is provided on the electrode pad 22 in the opening 23a, and comprises a base element 24a and a lead-in projection 24b. The bump element 25 is provided in direct contact with the top surface of the base element 24a and the lead-in projection 24b in the electroconductive connecting element 24, and extends outside from the opening 23a.

The electroconductive connecting element 24 of the electronic component X2 has a lead-in projection 24b that is in contact with the bump element 25. The occurrence of open defects in the bump electrode structure is appropriately inhibited by the action of the lead-in projection 24b in the manufacturing process of the electronic component X2. Specifically, the height H of the electroconductive connecting element 24 from the substrate 21, the theoretical penetration depth h of the bump element 25, and the thickness L of the insulating film 23 satisfy the above-described Eq. (1) in the same manner as in the electronic component X1.

FIGS. 9 to 11 depict the method for manufacturing the electronic component X2. To manufacture the electronic component X2, an electronic component whose condition is shown in FIG. 9a is first prepared through the same steps as those described above with reference to FIGS. 3a and 3b in relation to the manufacture of the electronic component X1. Specifically, electrode pads 22 are provided to the surface of the substrate 21 in the condition shown in FIG. 9a. An insulating film 23 having openings 23a at positions that correspond to the electrode pads 22 is further laminated and formed on the substrate 21. The insulating film 23 is formed such that the above-described Eq. (1) is satisfied for the thickness L shown in FIG. 8 in the ultimately obtained electronic component X2.

Figure 9A:
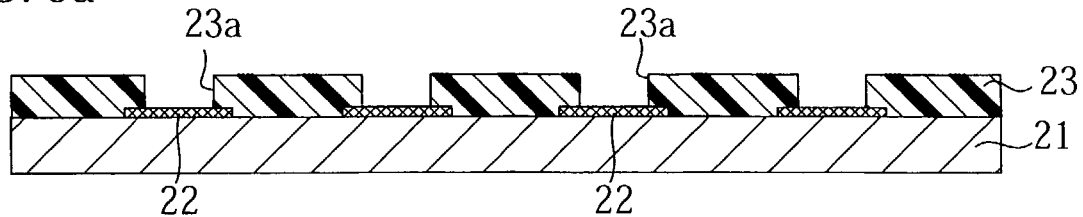
FIGS. 9a–9d depict some of the steps involved in the method for manufacturing the electronic component shown in FIG. 8.
Figure 9B:
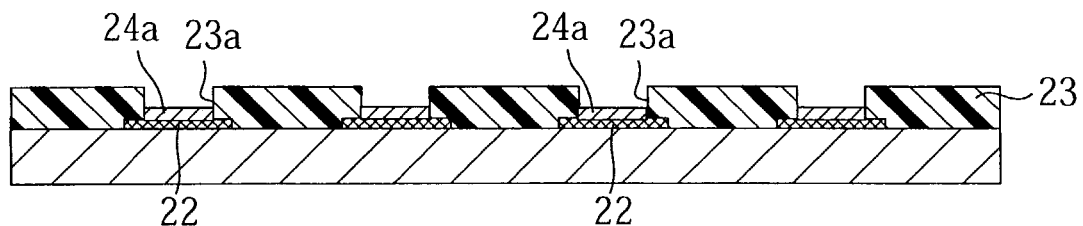

The base elements 24a of the electroconductive connecting elements 24 are formed on the electrode pads 22 in the openings 23a of the electronic component in such a condition, as shown in FIG. 9b. The base elements 24a can be formed by electroless plating or electroplating in the same manner as that described above with reference to FIG. 3c in relation to the formation of the electroconductive connecting elements 14 of the electronic component X1.

Figure 9C:
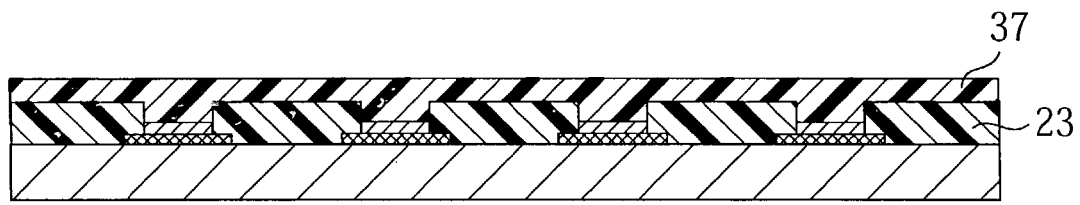

A resin film 37 is laminated and formed after the base elements 24a have been formed, as shown in FIG. 9c. To form the resin film 37, a resin composition in the form of a film is placed on the side of the lamination surface and compression bonded while heated to 50 to 240° C. Alternatively, it is possible to apply a liquid resin composition to the lamination surface by spin coating, and to dry the product. The same resin composition as the one used for the resin film 30 in the first embodiment can be used for forming the resin film 37.

Figure 9D:
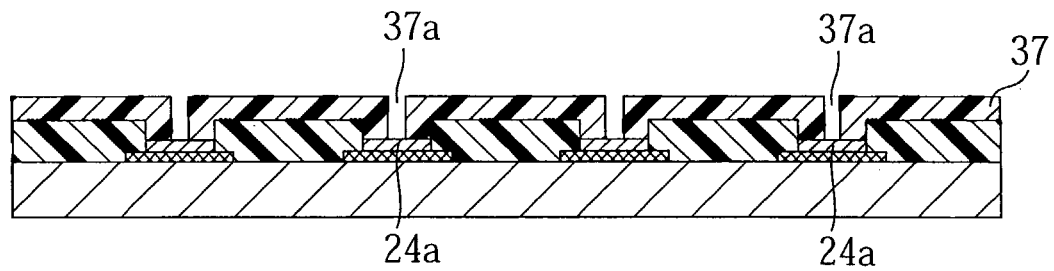

Openings 37a for forming lead-in projections 24b are formed in the resin film 37 at locations that correspond to the individual base elements 24a following the formation of the resin film 37, as shown in FIG. 9d. A UV-YAG laser, carbon dioxide laser, excimer laser, or the like may be used to form the openings 37a. Photolithography may be adopted for forming the openings 37a when a resin film 37 having photosensitivity has been formed. When photolithography is adopted, the openings 37a are formed to expose the base elements 24a by subjecting the resin film 37 to an exposure treatment through a specific photomask (not shown) and to a subsequent developing treatment.

Figure 10A:
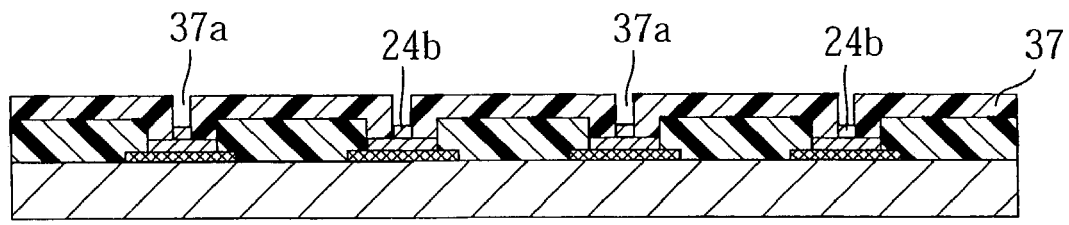
FIGS. 10a–10d depict steps that follow FIG. 9d.
Figure 10B:

The lead-in projections 24b are subsequently formed on the base elements 24a in the openings 37a, as shown in FIG. 10a. The lead-in projections 24b can be formed by electroless plating or electroplating in the same manner as that described above with reference to FIG. 3c in relation to the formation of the electroconductive connecting elements 14 of the electronic component X1. To form the electroconductive connecting elements 24, the base elements 24a and lead-in projections 24b are formed such that the above-described Eq. (1) is satisfied in relation to the height H shown in FIG. 8 in the ultimately obtained electronic component X2. The resin film 37 is subsequently removed by the action of an alkali stripping solution in the same manner as that described above with reference to FIG. 5c, as shown in FIG. 10b.

Figure 10C:
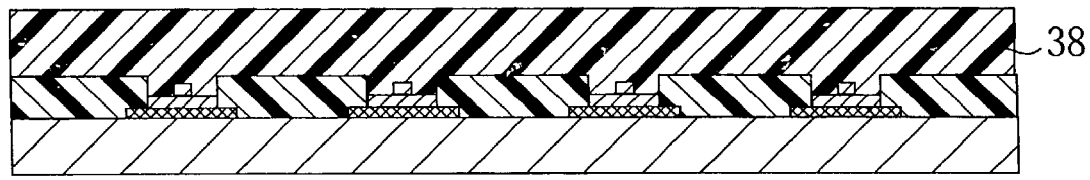

A resin film 38 is then laminated and formed as shown in FIG. 10c. To form the resin film 38, a resin composition in the form of a film is placed on the side of the lamination surface and compression bonded while heated to 50 to 140° C. Alternatively, it is possible to apply a liquid resin composition to the lamination surface by spin coating, and to dry the product. The same resin composition as the one used for the resin film 30 in the first embodiment can be used for forming the resin film 38.

Figure 10D:
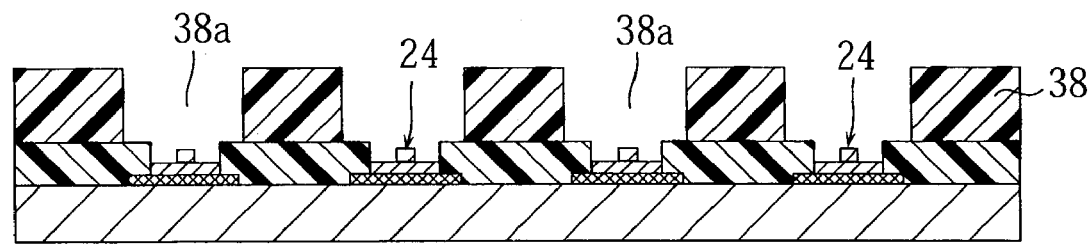

Openings 38a are formed in the resin film 38 at locations that correspond to the individual electroconductive connecting elements 24, as shown in FIG. 10d. A UV-YAG laser, carbon dioxide laser, excimer laser, or the like may be used to form the openings 38a. Photolithography may be adopted for forming the openings 38a when a resin film 38 having photosensitivity has been formed. When photolithography is adopted, the openings 38a are formed to expose the electroconductive connecting elements 24 by subjecting the resin film 38 to an exposure treatment through a specific photomask (not shown) and to a subsequent developing treatment.

Figure 11A:
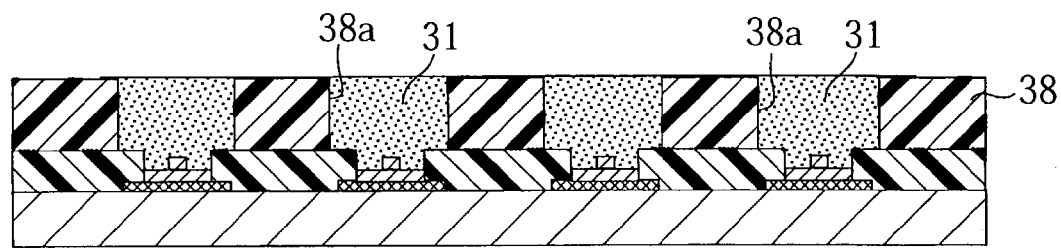
FIGS. 11a–11c depict steps that follow FIG. 10c.

The openings 38a are subsequently filled with solder paste 31, as shown in FIG. 11a. The filling with the solder paste 31 is performed by a printing technique that uses a squeegee (not shown). The constituent material of the solder paste 31, the material of the squeegee, and the type of squeegee used in the present step are the same as those described above with reference to FIG. 5a in relation to the first embodiment.

Figure 11B:
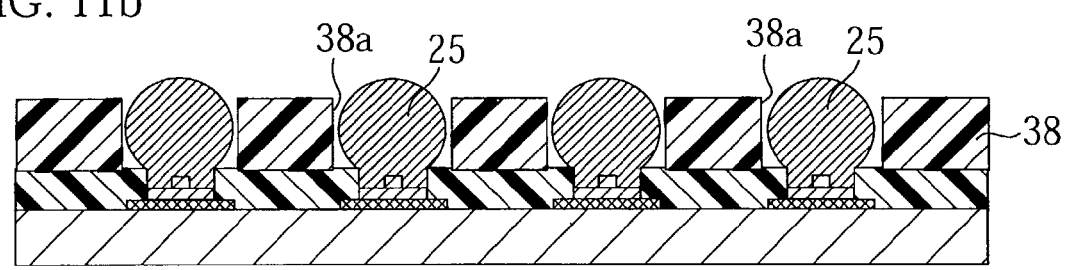

Bump elements 25 are subsequently formed through a heating treatment, as shown in FIG. 11b. Specifically, the solder paste 31 that fills the openings 38a is first melted by heating. The flux vehicle contained in the solder paste 31 is thereby evaporated off, and the solder powder melts and aggregates. The bump elements 25 are formed by the subsequent cooling.

Figure 11C:
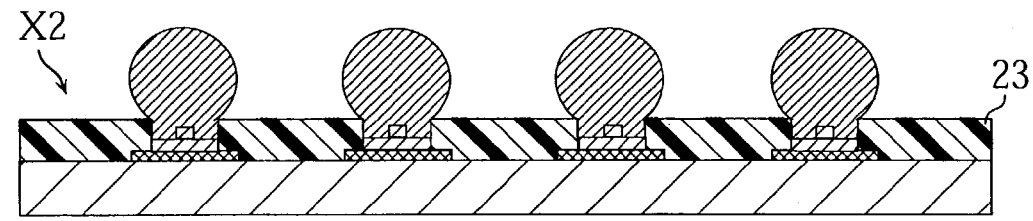
Figure 12A:
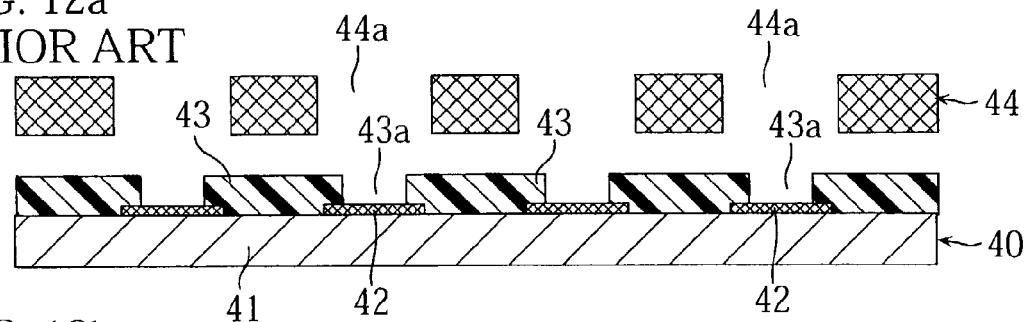
FIGS. 12a–12e depict some of the steps involved in a conventional method for manufacturing an electronic component with bump electrodes.
Figure 12B:
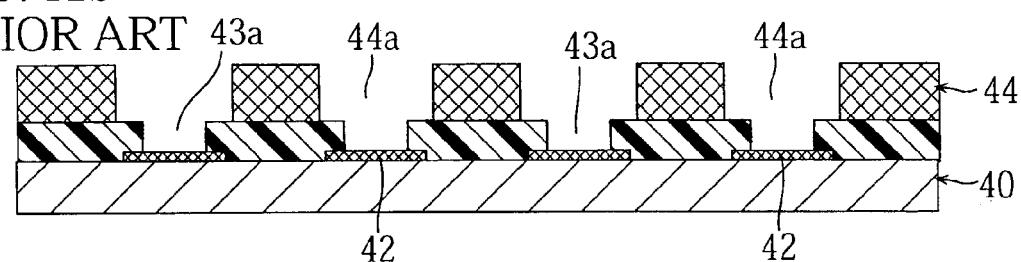
Figure 12C:
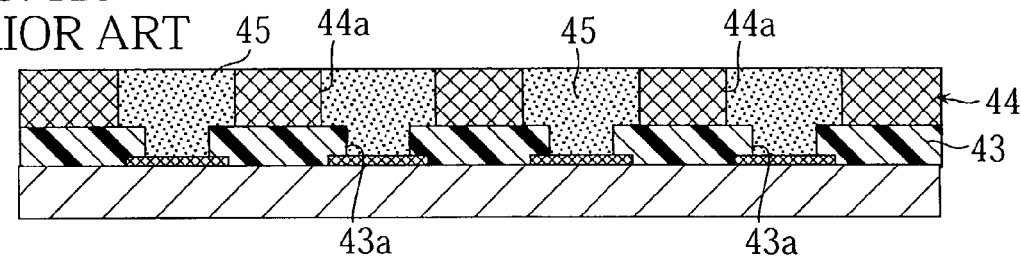
Figure 12D:
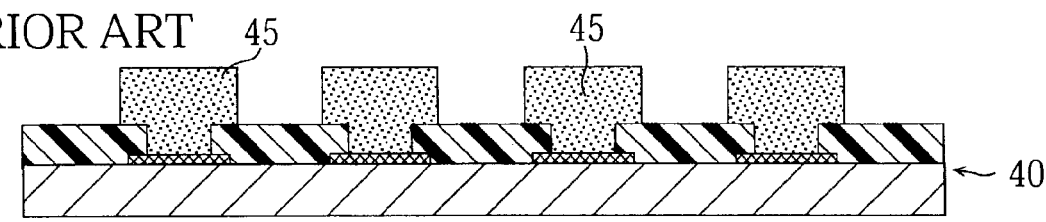
Figure 12E:
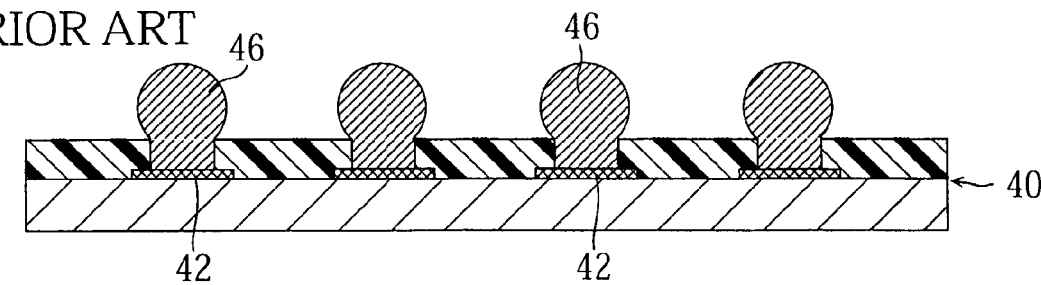
Figure 13A:
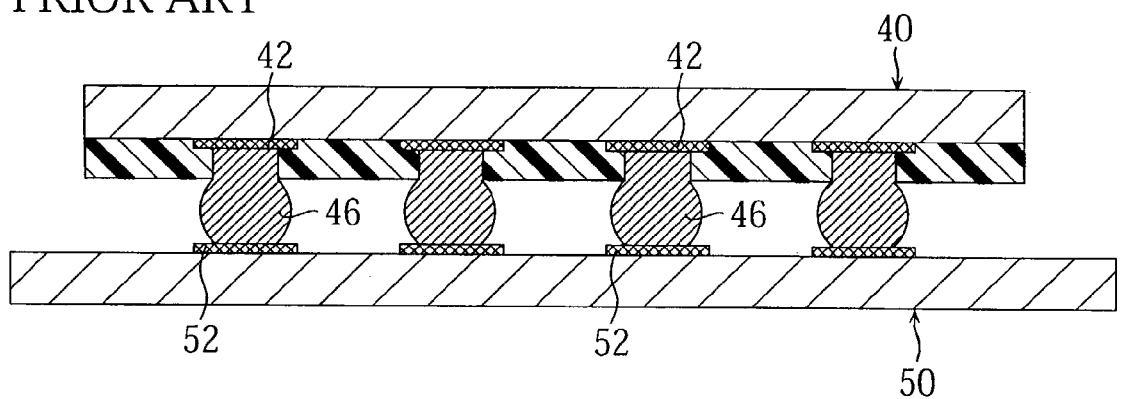
FIGS. 13a and 13b depict the steps for packaging a conventional electronic component.
Figure 13B:
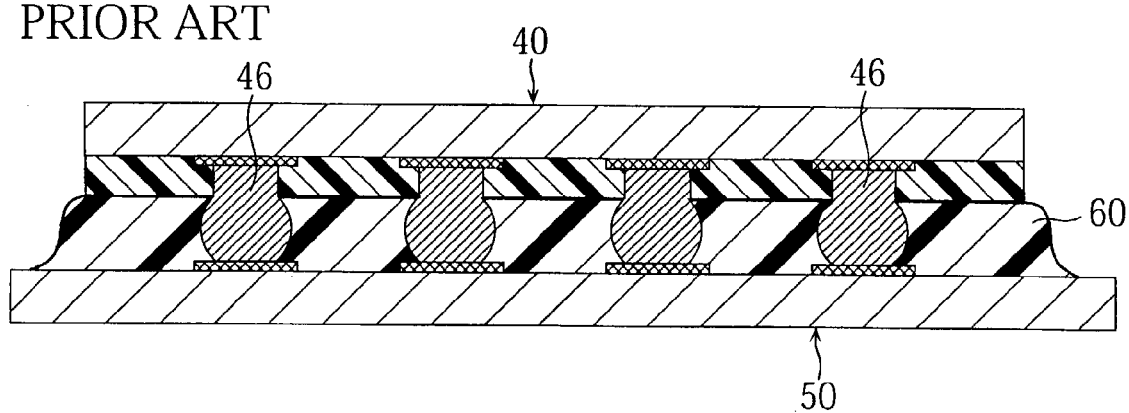
Figure 14A:
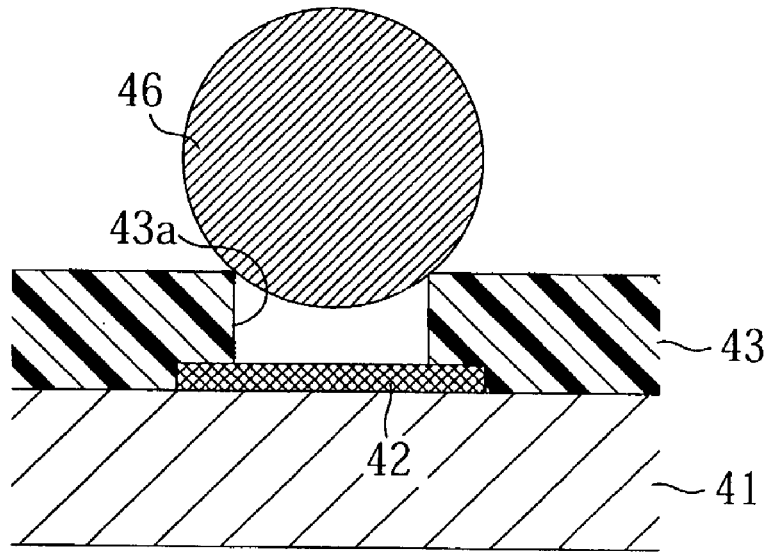
FIGS. 14a and 14b depict the open defects occurring in a conventional electronic component with bump electrodes.
Figure 14B:
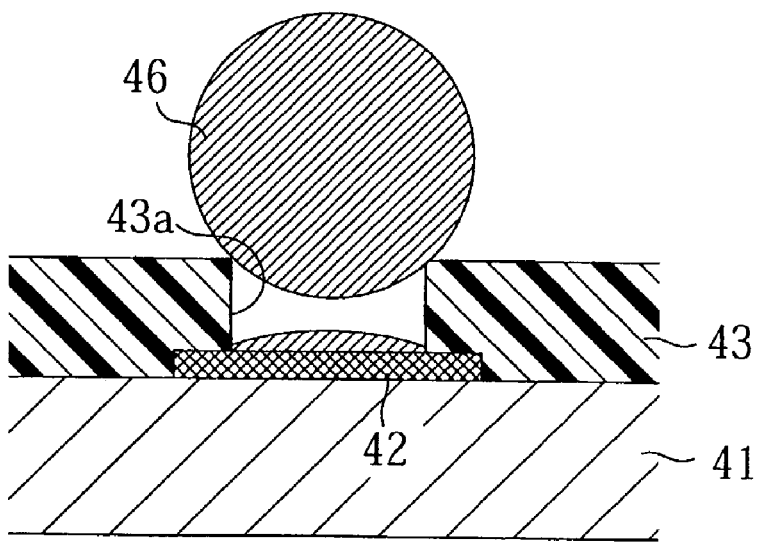

The resin film 38 is subsequently removed by the action of an alkali stripping solution, as shown in FIG. 11c. At this time, an alkali stripping solution with a pH of 11.5 or less should be used in order to minimize damage to the insulating film 23. To perform such an alkali removal in an adequate manner, a combination of an insulating film 23 and a resin film 38 that have significant differences in terms of resistance to the alkali stripping solution is adopted in the present embodiment.

The electronic component X2 is manufactured in the above-described series of steps in a manner such that the height H of the electroconductive connecting elements 24 from the substrate 21, the theoretical penetration depth h of the bump elements 25, and the thickness L of the insulating film 23 satisfy the above-described Eq. (1). Consequently, the electronic component X2, while comprising an insulating film 23 of adequate thickness and bump elements 25 of adequate height, does not develop any open defects between the electrode pads 22 and the bump elements 25. In addition, the electronic component X2 with bump electrodes thus manufactured can be flip-chip bonded to a wiring board in the same manner as the electronic component X1 when the electronic component X2 is, for example, a semiconductor chip.

The first and second embodiments of the present invention were described with reference to fragmentary cross-sectional views. The electronic components X1 and X2 with bump electrodes of the present invention can also be manufactured from wafers and other large boards in commercial production lines.

EXAMPLES

Examples of the present invention will now be described together with comparative examples.

Inventive Example 1

An epoxy acrylate resin film was formed by screen printing as an insulating film having photosensitivity so as to cover the electrode pads on the surface of a wiring board having Cu electrode pads (electrode diameter: 110 µm; electrode pitch: 220 µm; number of electrodes: 3000). The film thickness was set to 30 µm. An exposure treatment and a subsequent developing treatment were then performed on the insulating film, and a plurality of openings with a diameter of 90 µm was formed so as to expose each electrode pad. A 1.0% aqueous solution of sodium carbonate ($Na_2CO_3$) was used as the developing solution for the developing treatment. An Ni plating layer with a thickness of 15 µm was subsequently formed by electroless plating on the electrode pads of the openings. An Au plating layer with a thickness of 0.1 µm was then formed by electroless plating on the Ni plating layer. Electroconductive connecting elements comprising an Ni plating layer and an Au plating layer were thereby formed on the electrode pads.

An acrylate resin film having photosensitivity was subsequently laminated and formed on the insulating film so as to cover the openings in the insulating film. The film thickness was set to 50 µm. An exposure treatment and a subsequent developing treatment were then performed on the resin film, and a plurality of openings with a diameter of 200 µm was formed so as to expose each electroconductive connecting element. A 1.0% $Na_2CO_3$ aqueous solution was used as the developing solution for the developing treatment. The openings were then filled with solder paste by performing two cycles of squeegeeing with a urethane rubber squeegee. The solder paste of the present embodiment comprised 10 parts by weight of a resin fraction comprising rosin, an activator, a solvent, and a thixotropic agent, and 90 parts by weight of a solder powder (Sn-3.5% Ag solder) with a grain size of 25 µm or less; and the volume ratio of the solder powder was about 54 vol %. Bump elements were subsequently formed from the solder paste in each opening by conducting a heating treatment at a maximum temperature of 240° C. The acrylate resin film was then removed using a 5% monoethanolamine aqueous solution as an alkali stripping solution. As a result of these steps, it was possible to obtain a wiring board that had bump electrodes based on bump elements whose height from the insulating film was 100 μm and whose height nonuniformity was 3 μm. As used herein, the term "height nonuniformity" refers to variations of +3 μm in relation to the mean height.

Inventive Example 2

An epoxy acrylate resin film was formed by screen printing as an insulating film having photosensitivity so as to cover the electrode pads on the surface of a semiconductor chip having Cu electrode pads (electrode diameter: 90 μm; electrode pitch: 220 μm; number of electrodes: 3000). The film thickness was set to 10 μm. An exposure treatment and a subsequent developing treatment were then performed on the insulating film, and a plurality of openings with a diameter of 70 μm was formed so as to expose each electrode pad. A 1% aqueous solution of tetramethylammonium hydroxide (TMAH) was used as the developing solution for the developing treatment. An Ni plating layer with a thickness of 3 μm was subsequently formed by electroless plating on the electrode pads of the openings. An Au plating layer with a thickness of 0.1 μm was then formed by electroless plating on the Ni plating layer. Electroconductive connecting elements comprising an Ni plating layer and an Au plating layer were thereby formed on the electrode pads.

An acrylate resin film having photosensitivity was subsequently laminated and formed on the insulating film so as to cover the openings in the insulating film. The film thickness was set to 150 μm. An exposure treatment and a subsequent developing treatment were then performed on the resin film, and a plurality of openings with a diameter of 200 μm was formed so as to expose each electroconductive connecting element. A 1.0% Na2CO3 aqueous solution was used as the developing solution for the developing treatment. The openings were then filled with a solder paste containing solder powder (Sn-3.5% Ag solder) with a grain size of 25 μm or less by performing two cycles of squeegeeing with a urethane rubber squeegee. Bump elements were subsequently formed from the solder paste in each opening by conducting a heating treatment at a maximum temperature of 240° C. The acrylate resin film was then removed using a 5% monoethanolamine aqueous solution as an alkali stripping solution. As a result of these steps, it was possible to obtain a semiconductor chip that had bump electrodes based on bump elements whose height from the insulating film was 160 μm and whose height nonuniformity was 5 μm.

Inventive Example 3

The same wiring board as in Inventive Example 1 was prepared by the same steps as in Inventive Example 1 up to the formation of openings with a diameter of 200 μm in the photosensitive acrylate resin film, and flux was applied to the electrode pads exposed in the openings of the resin film in the wiring board. Solder balls (Sn-3.5% Ag solder) with a diameter of 130 μm were then placed on the electrode pads coated with the flux. A bump element was subsequently formed from the solder ball in each opening by conducting a heating treatment at a maximum temperature of 240° C. The acrylate resin film was then removed using a 5% monoethanolamine aqueous solution as an alkali stripping solution. As a result of these steps, it was possible to obtain a wiring board that had bump electrodes based on bump elements whose height from the insulating film was 110 μm and whose height nonuniformity was 2 μm.

Inventive Example 4

The same semiconductor chip as in Inventive Example 2 was prepared by the same steps as in Inventive Example 2 up to the formation of openings with a diameter of 200 μm in the photosensitive acrylate resin film, and flux was applied to the electrode pads exposed in the openings of the resin film in the semiconductor chip. Solder balls (Sn-3.5% Ag solder) with a diameter of 160 μm were then placed on each of the electrode pads coated with the flux. A bump element was subsequently formed from the solder ball in each opening by conducting a heating treatment at a maximum temperature of 240° C. The photosensitive acrylate resin film was then removed using a 5% monoethanolamine aqueous solution as an alkali stripping solution. As a result of these steps, it was possible to obtain a semiconductor chip that had bump electrodes based on bump elements whose height from the insulating film was 150 μm and whose height nonuniformity was 4 μm.

Inventive Example 5

The steps from the formation of the insulating film to the formation of the bump elements were performed in the same manner as in Inventive Example 1, except that a Cu plating layer with a thickness of 15 μm and an overlying Sn plating layer with a thickness of 0.1 μm were formed instead of the Ni plating layer with a thickness of 15 μm and the overlying Au plating layer with a thickness 0.1 μm during the formation of electroconductive connecting elements by electroless plating. As a result, it was possible to obtain a wiring board that had bump electrodes based on bump elements whose height from the insulating film was 102 μm and whose height nonuniformity was 4 μm.

Inventive Example 6

The steps from the formation of the insulating film to the formation of the bump elements were performed in the same manner as in Inventive Example 3, except that a Cu plating layer with a thickness of 15 μm and an overlying Sn plating layer with a thickness of 0.1 μm were formed instead of the Ni plating layer with a thickness of 15 μm and the overlying Au plating layer with a thickness 0.1 μm during the formation of electroconductive connecting elements by electroless plating. As a result, it was possible to obtain a wiring board that had bump electrodes based on bump elements whose height from the insulating film was 112 μm and whose height nonuniformity was 2 μm.

Inventive Example 7

An epoxy acrylate resin film was formed by screen printing as an insulating film having photosensitivity so as to cover the electrode pads on the surface of a semiconductor chip having Al electrode pads (electrode diameter: 90 μm; electrode pitch: 220 μm; number of electrodes: 3000). The film thickness was set to 10 μm. An exposure treatment and a subsequent developing treatment were then performed on the insulating film, and a plurality of openings with a diameter of 70 μm was formed so as to expose each electrode pad. A 1% TMAH aqueous solution was used as the developing solution for the developing treatment. An Ni plating layer with a thickness of 3 μm was subsequently formed by electroless plating on the electrode pads of the openings. An Au plating layer with a thickness of 0.1 μm was then formed by electroless plating on the Ni plating layer. Electroconductive connecting elements comprising an Ni plating layer and an Au plating layer were thereby formed on the electrode pads.

An acrylate-resin film having photosensitivity was subsequently laminated and formed on the insulating film so as to cover the openings in the insulating film. The film thickness was set to 150 μm. An exposure treatment and a subsequent developing treatment were then performed on the resin film, and a plurality of openings with a diameter of 200 μm was formed so as to expose each electroconductive connecting element. A 1.0% Na2CO3 aqueous solution was used as the developing solution for the developing treatment. Flux was subsequently applied to the electrode pads exposed in the openings of the resin film. Solder balls (Sn-3.5% Ag solder) with a diameter of 180 μm were then placed on each of the electrode pads coated with the flux. A bump element was subsequently formed from the solder ball in each opening by conducting a heating treatment at a maximum temperature of 240° C. The acrylate resin film was then removed using a 5% monoethanolamine aqueous solution as an alkali stripping solution. As a result of these steps, it was possible to obtain a semiconductor chip that had bump electrodes based on bump elements whose height from the insulating film was 172 μm and whose height nonuniformity was 4 μm.

Inventive Example 8

The steps from the formation of the insulating film to the formation of the bump elements were conducted in the same manner as in Inventive Example 7, except that solder balls (Sn-3.5% Ag solder) with a diameter of 160 μm were placed on the electrode pads in the openings of the resin film instead of the solder balls (Sn-3.5% Ag solder) with a diameter of 180 μm during the formation of the bump elements. As a result, it was possible to obtain a semiconductor chip that had bump electrodes based on bump elements whose height from the insulating film was 151 μm and whose height nonuniformity was 2 μm.

Comparative Example 1

An epoxy acrylate resin film was formed by screen printing as an insulating film having photosensitivity so as to cover the electrode pads on the surface of a wiring board having Cu electrode pads (electrode diameter: 110 μm; electrode pitch: 220 μm; number of electrodes: 3000). The film thickness was set to 30 μm. An exposure treatment and a subsequent developing treatment were then performed on the insulating film, and a plurality of openings with a diameter of 90 μm was formed so as to expose each electrode pad. An acrylate resin film having photosensitivity was subsequently laminated and formed on the insulating film so as to cover the openings in the insulating film. The film thickness was set to 50 μm. An exposure treatment and a subsequent developing treatment were then performed on the resin film, and a plurality of openings with a diameter of 200 μm was formed so as to expose each electroconductive connecting element. A 1.0% Na2CO3 aqueous solution was used as the developing solution for the developing treatment. The openings were then filled with a solder paste containing solder powder (Sn-3.5% Ag solder) with a grain size of 25 μm or less by performing two cycles of squeegeeing with a urethane rubber squeegee. Bump elements were subsequently formed from the solder paste in each opening by conducting a heating treatment at a maximum temperature of 240° C. The acrylate resin film was then removed using a 5% monoethanolamine aqueous solution as an alkali stripping solution. As a result of these steps, a plurality of balled up bump elements was formed without filling the openings in the resin film, open defect occurred at a plurality of locations, and an adequate wiring board with bump electrodes was impossible to obtain.

Comparative Example 2

An epoxy acrylate resin film was formed by screen printing as an insulating film having photosensitivity so as to cover the electrode pads on the surface of a semiconductor chip having Cu electrode pads (electrode diameter: 90 μm; electrode pitch: 220 μm; number of electrodes: 3000). The film thickness was set to 10 μm. An exposure treatment and a subsequent developing treatment were then performed on the insulating film, and a plurality of openings with a diameter of 70 μm was formed so as to expose each electrode pad. An acrylate resin film having photosensitivity was subsequently laminated and formed on the insulating film so as to cover the openings in the insulating film. The film thickness was set to 50 μm. An exposure treatment and a subsequent developing treatment were then performed on the resin film, and a plurality of openings with a diameter of 200 μm was formed so as to expose each electroconductive connecting element. A 1.0% Na2CO3 aqueous solution was used as the developing solution for the developing treatment. The openings were then filled with a solder paste containing solder powder (Sn-3.5% Ag solder) with a grain size of 25 μm or less by performing two cycles of squeegeeing with a urethane rubber squeegee. Bump elements were subsequently formed from the solder paste in each opening by conducting a heating treatment at a maximum temperature of 240° C. The acrylate resin film was then removed using a 5% monoethanolamine aqueous solution as an alkali stripping solution. As a result of these steps, a plurality of balled up bump elements was formed without filling the openings in the resin film, open defect occurred at a plurality of locations, and an adequate semiconductor chip with bump electrodes was impossible to obtain.

[Conclusion]

According to the present invention, a semiconductor chip or a wiring board is manufactured by forming an insulating film on the surface thereof and providing bump electrodes on the side of the insulating film, wherein occurrence of open defects in the bump electrodes can be appropriately prevented while an insulating film of adequate thickness and bump elements of adequate height can be formed.

What is claimed is:

1. An electronic component with bump electrodes, comprising:
   a substrate;
   electrode pads provided on the substrate;
   an insulating film that has openings in correspondence with the electrode pads and is laminated and formed on the substrate;
   electroconductive connecting elements provided on the electrode pads in the openings, each of the electroconductive connecting elements entirely accommodated in a respective one of the openings In contact with said insulating film; and
   bump elements that are in direct contact with the electroconductive connecting elements and project from the openings, each of the bump elements including a ball portion and a non-ball portion;

wherein each of the electroconductive connecting elements is entirely accommodated in a respective one of the openings in contact with the insulating film, only the non-ball portion of each of the bump elements entering into respective one of the openings in direct contact with the insulating film, of the bump elements being formed entirely above a respective one of the electroconductive connecting elements; and wherein an annular gap is formed between the insulating film and the ball portion of each of the bump elements.

2. The electronic component according to claim 1, wherein the electroconductive connecting elements have lead-in projections in contact with the bump element.

3. The electronic component according to claim 1, wherein each of the electroconductive connecting elements has a height H from the substrate, wherein each of the bump elements is substantially a sphere having a theoretical penetration depth h into a respective one of the openings and all of the bump elements have a substantially identical volume, wherein the insulating film has a thickness L, and wherein the height H, the theoretical penetration depth h and the thickness L are related as $H+h \geq L$.

4. The electronic component according to claim 1, wherein the electroconductive connecting elements have a laminated structure that comprises a plurality of layers.

5. The electronic component according to claim 1, wherein at least a portion of each electroconductive connecting element held in contact with a respective one of the bump elements is composed of Au or Sn.

6. The electronic component according to claim 1, wherein at least a portion of each electroconductive connecting element held in contact with a respective one of the bump elements is composed of a material capable of melting at or below the melting temperature of the bump elements.

7. The electronic component according to claim 1, wherein the bump elements are composed of a metal material selected from the group comprising tin, Indium, lead, bismuth, silver, copper, zinc, and antimony.

8. A method for manufacturing an electronic component with bump electrodes, comprising the steps of:

forming an insulating film on a substrate that is provided with electrode pads;

forming openings in the insulating film in correspondence with the electrode pads;

forming electroconductive connecting elements in the openings of the insulating film in a manner such that each of the electroconductive connecting elements is entirely accommodated in a respective one of the openings in contact with the insulating film forming bump elements on the electroconductive connecting elements so as to be in direct contact with the electroconductive connecting elements and project from the openings, each of the bump elements including a ball portion and a non-ball portion, only the non-ball portion of each of the bump elements entering into a respective one of the openings, each of the bump elements being formed entirely above a respective one of the electroconductive connecting elements; and wherein an annular gap is formed between the insulating film and the ball portion of each of the bump elements.

9. The method according to claim 8, wherein the step of forming the electroconductive connecting elements is conducted by electroless plating and/or electroplating.

10. The method according to claim 9, wherein a plurality of plating materials are deposited in a sequential manner during said forming of the electroconductive connecting elements.

11. The method according to claim 8, wherein said forming of the electroconductive connecting elements comprises forming lead-in projections that extend in a direction of positions in which the bump elements are formed.

12. The method according to claim 8, wherein said forming of the bump elements comprises:

laminating and forming a resin film on the insulating film;

forming openings in the resin film so that the electroconductive connecting elements are exposed;

feeding solder paste to the openings of the resin film;

forming bump elements from the wider paste through a heating treatment, and stripping the resin film from the insulating film.

13. The method according to claim 8, wherein said forming of the bump elements comprises:

laminating and forming a resin film on the insulating film;

forming openings in the resin film so as to expose the electroconductive connecting elements;

feeding molten solder to the openings of the resin film;

cooling the molten solder and forming bump elements; and stripping the resin film from the insulating film.

14. The method according to claim 8, wherein said forming of the bump element comprises:

laminating and forming a resin film on the insulating film;

forming openings in the resin film so as to expose the electroconductive connecting elements;

depositing solder material in the openings of the resin film by plating;

forming bump elements from the solder material through a heating treatment; and stripping the resin film from the insulating film.

15. The method according to claim 11, wherein the resin film is a photosensitive resin film.

16. The method according to claim 8, wherein said forming of the bump elements comprises:

placing a solder ball in each of the openings in the insulating film; and forming bump elements from the solder balls through a heating treatment.

17. The method according to claim 8, wherein the electroconductive connecting elements and bump elements are formed such that each of the electroconductive connecting elements has a height H from the substrate, each of the bump elements is substantially a sphere having a theoretical penetration depth h into a respective one of the openings and all of the bump elements have a substantially identical volume, the insulating film has a thickness L, and the height H, the theoretical penetration depth h and the thickness L are related as $H+h \geq L$.

* * * * *

UNITED STATES PATENT AND TRADEMARK OFFICE
CERTIFICATE OF CORRECTION

PATENT NO. : 7,189,927 B2 Page 1 of 1
APPLICATION NO. : 10/434151
DATED : March 13, 2007
INVENTOR(S) : Seiki Sakuyama It is certified that error appears in the above-identified patent and that said Letters Patent is hereby corrected as shown below:

Title Page, Column 2 Item [74] (Attorney, Agent, or Firm), Line 1, change "Stass" to --Staas--.

Column 18, Line 62, change "In" to --in--.

Column 19, Line 6, after "film," insert --each--.

Column 19, Line 38, change "Indium," to --indium,--.

Column 20, Line 18, change "wider" to --solder--.

Column 20, Line 31, change "element" to --elements--.

Signed and Sealed this

Twelfth Day of February, 2008

JON W. DUDAS
*Director of the United States Patent and Trademark Office*